US007791584B2

(12) United States Patent
Korcharz et al.

(10) Patent No.: US 7,791,584 B2
(45) Date of Patent: Sep. 7, 2010

(54) THERMAL LIMITED BACKLIGHT DRIVER

(75) Inventors: Dror Korcharz, Bat Yam (IL); Arkadiy Peker, New Hyde Park, NY (US)

(73) Assignee: Microsemi Corp.-Analog Mixed Signal Group Ltd., Hod Hasharon (IL)

( * ) Notice: Subject to any disclaimer, the term of this patent is extended or adjusted under 35 U.S.C. 154(b) by 871 days.

(21) Appl. No.: 11/676,312

(22) Filed: Feb. 19, 2007

(65) Prior Publication Data

US 2007/0195024 A1 Aug. 23, 2007

Related U.S. Application Data

(60) Provisional application No. 60/775,787, filed on Feb. 23, 2006, provisional application No. 60/803,366, filed on May 28, 2006, provisional application No. 60/868,675, filed on Dec. 5, 2006.

(51) Int. Cl.
*G09G 3/36* (2006.01)
*H03K 3/017* (2006.01)
*H03K 7/08* (2006.01)

(52) U.S. Cl. ........................ 345/101; 345/102; 327/175

(58) Field of Classification Search ......... 345/101–102; 327/175

See application file for complete search history.

(56) References Cited

U.S. PATENT DOCUMENTS

| | | | | |
|---|---|---|---|---|
| 6,127,783 | A | 10/2000 | Pashley et al. | |
| 6,194,839 | B1 | 2/2001 | Chang | |
| 6,201,353 | B1 | 3/2001 | Chang et al. | |
| 6,441,558 | B1 | 8/2002 | Muthu | |
| 6,529,182 | B1 | 3/2003 | Burton | |
| 6,964,500 | B2 | 11/2005 | Sakai | |
| 7,183,727 | B2 | 2/2007 | Ferguson et al. | |
| 2002/0005861 | A1 * | 1/2002 | Lewis | 345/691 |
| 2002/0149892 | A1 | 10/2002 | Williams | |
| 2005/0212459 | A1 | 9/2005 | Patel et al. | |
| 2005/0259439 | A1 | 11/2005 | Cull et al. | |
| 2006/0007097 | A1 | 1/2006 | Ichikawa | |
| 2006/0050529 | A1 | 3/2006 | Chou et al. | |
| 2006/0221047 | A1 | 10/2006 | Tanizoe et al. | |
| 2007/0013322 | A1 * | 1/2007 | Tripathi et al. | 315/291 |
| 2007/0090766 | A1 * | 4/2007 | LaGrave et al. | 315/82 |

* cited by examiner

*Primary Examiner*—Bipin Shalwala
*Assistant Examiner*—Jonathan Boyd
(74) *Attorney, Agent, or Firm*—Simon Kahn

(57) ABSTRACT

A system for powering and controlling an LED backlight, the system comprising: a control circuitry; a plurality of LED strings; a pulse width modulation functionality associated with the control circuitry and arranged to pulse width modulate a current flow through each of the plurality of LED strings; and a plurality of current limiters responsive to the control circuitry, each of the plurality of current limiters being associated with a particular one of the plurality of LED strings and operative to limit current flow of the pulse width modulated current there-through, the control circuitry being operative in the event of a thermal condition of one of the plurality of current limiters to reduce a duty cycle of the pulse width modulation functionality of the current flow through the one of the plurality of current limiters.

26 Claims, 11 Drawing Sheets

THERMAL LIMITED BACKLIGHT DRIVER

CROSS-REFERENCE TO RELATED APPLICATIONS

This application claims priority from: U.S. Provisional Patent Application Ser. No. 60/775,787 filed Feb. 23, 2006 entitled "Thermal Limited Backlight Driver"; U.S. Provisional Patent Application Ser. No. 60/803,366 filed May 28, 2006 entitled "Voltage Controlled Backlight Driver"; and U.S. Provisional Patent Application Ser. No. 60/868,675 filed Dec. 5, 2006 entitled "Voltage Controlled Backlight Driver", the entire contents of each of which are incorporated herein by reference.

BACKGROUND OF THE INVENTION

The present invention relates to the field of light emitting diode based lighting and more particularly to a system for powering and controlling a plurality of LED strings having a controllable power source.

Light emitting diodes (LEDs) and in particular high intensity and medium intensity LED strings are rapidly coming into wide use for lighting applications. LEDs with an overall high luminance are useful in a number of applications including, but not limited to, backlighting for liquid crystal display (LCD) based monitors and televisions, collectively hereinafter referred to as a monitor. In a large LCD monitor the LEDs are typically supplied in one or more strings of serially connected LEDs, thus sharing a common current.

In order supply a white backlight for the monitor, one of two basic techniques are commonly used. In a first technique one or more strings of "white" LEDs are utilized, the white LEDs typically comprising a blue LED with a phosphor which absorbs the blue light emitted by the LED and emits a white light. In a second technique one or more individual strings of colored LEDs are placed in proximity so that in combination their light is seen as a white light. Often, two strings of green LEDs are utilized to balance one string each of red and blue LEDs.

In either of the two techniques, the strings of LEDs are in one embodiment located at one end or one side of the monitor, the light being diffused to appear behind the LCD by a diffuser. In another embodiment the LEDs are located directly behind the LCD, the light being diffused so as to avoid hot spots by a diffuser. In the case of colored LEDs, a further mixer is required, which may be part of the diffuser, to ensure that the light of the colored LEDs are not viewed separately, but are rather mixed to give a white light. The white point of the light is an important factor to control, and much effort in design and manufacturing is centered on the need for a controlled white point.

Each of the colored LED strings is typically controlled by both amplitude modulation (AM) and pulse width modulation (PWM) to achieve an overall fixed perceived luminance and color balance. AM is typically used to set the white point produced by the disparate colored LED strings by setting the constant current flow through the LED strings to a value determined as part of a white point calibration process and PWM is typically used to variably control the overall luminance, or brightness, of the monitor without affecting the white point balance. Thus the current, when pulsed on, is held constant to maintain the white point produced by the combination of disparate colored LED strings, and the PWM duty cycle is controlled to dim or brighten the backlight by adjusting the average current over time. The PWM duty cycle of each color is further modified to maintain the white point, preferably responsive to a color sensor. It is to be noted that different colored LEDs age, or reduce their luminance as a function of current, at different rates and thus the PWM duty cycle of each color must be modified over time to maintain the white point. There is however a limit to the range of the PWM duty cycle and unfortunately when it has been reached, the maximum luminance begins to decline.

Each of the disparate colored LED strings has a voltage requirement associated with the forward voltage drop of the LEDs and the number of LEDs in the LED string. In the event that multiple LED strings of each color are used, the voltage drop across strings of the same color having the same number of LEDs per string may also vary due to manufacturing tolerances and temperature differences. Ideally, separate power sources are supplied for each LED string, the power sources being adapted to adjust their voltage output to be in line with voltage drop across the associated LED string. Such a large plurality of power sources effectively minimizes excess power dissipation however the requirement for a large plurality of power sources is costly.

An alternative solution, which reduces the number of power sources required, is to supply a single power source for each color. Thus a plurality of LED strings of a single color is driven by a single power source, and the number of power sources required is reduced to the number of different colors, i.e. typically to 3. Unfortunately, since as indicated above different LED strings of the same color may exhibit different voltage drops, such a solution further requires an active element in series with each LED string to compensate for the different voltage drops so as to ensure an essentially equal current through each of the LED strings of the same color.

In one embodiment, in which a single power source is used for a plurality of LED strings of a single color, power through each of the LED strings is controlled by a single controller chip, the controller chip exhibiting a dissipative active element operative to compensate for the different voltage drops. Unfortunately, the dissipative elements limit the range of operation of the controller chip, since the dissipative elements are a significant source of heat. Placing the dissipative elements external of the controller chip solves the problem of heat but unfortunately results in a higher cost and footprint and is thus less than optimal. In summary, a controller chip comprising within dissipative elements is limited by thermal constraints at least partially as a result of the action of the dissipative elements, yet still must provide both AM and PWM modulation.

As the LED strings age, their voltage drops change. Furthermore, the voltage drops of the LED strings are a function of temperature, and thus the voltage output of the power source must initially be set high enough so as to supply sufficient voltage over the operational life of the LED strings taking into account a range of operating temperatures. Utilizing a single fixed voltage power source for each color thus results in excess power dissipation, as the power source is set to supply a sufficient voltage for all the LED strings over their operational life, which must be dissipated for LED strings exhibiting a lower voltage drop.

What is needed, and not provided by the prior art, is a means for controlling the current flow through a plurality of LED strings responsive to thermal constraints.

SUMMARY OF THE INVENTION

Accordingly, it is a principal object of the present invention to overcome the disadvantages of prior art. This is provided in the present invention by a backlighting system exhibiting a plurality of LED strings, a plurality of current limiters each in series with a particular one of the plurality of LED strings, and a pulse width modulation functionality. The control circuitry is operative to monitor at least one thermal condition responsive to the plurality of current limiters, and in the event of a predetermined thermal condition, reduce the thermal stress by reducing the duty cycle of at least one of the plurality of LED strings.

The invention provides for a system for powering and controlling an LED backlight, the system comprising: a control circuitry; a plurality of LED strings; a pulse width modulation functionality associated with the control circuitry and arranged to pulse width modulate a current flow through each of the plurality of LED strings; and a plurality of current limiters responsive to the control circuitry, each of the plurality of current limiters being associated with a particular one of the plurality of LED strings and operative to limit current flow of the pulse width modulated current there-through, the control circuitry being operative in the event of a thermal condition of one of the plurality of current limiters to reduce a duty cycle of the pulse width modulation functionality of the current flow through the one of the plurality of current limiters.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF PREFERRED EMBODIMENTS

Figure 1:
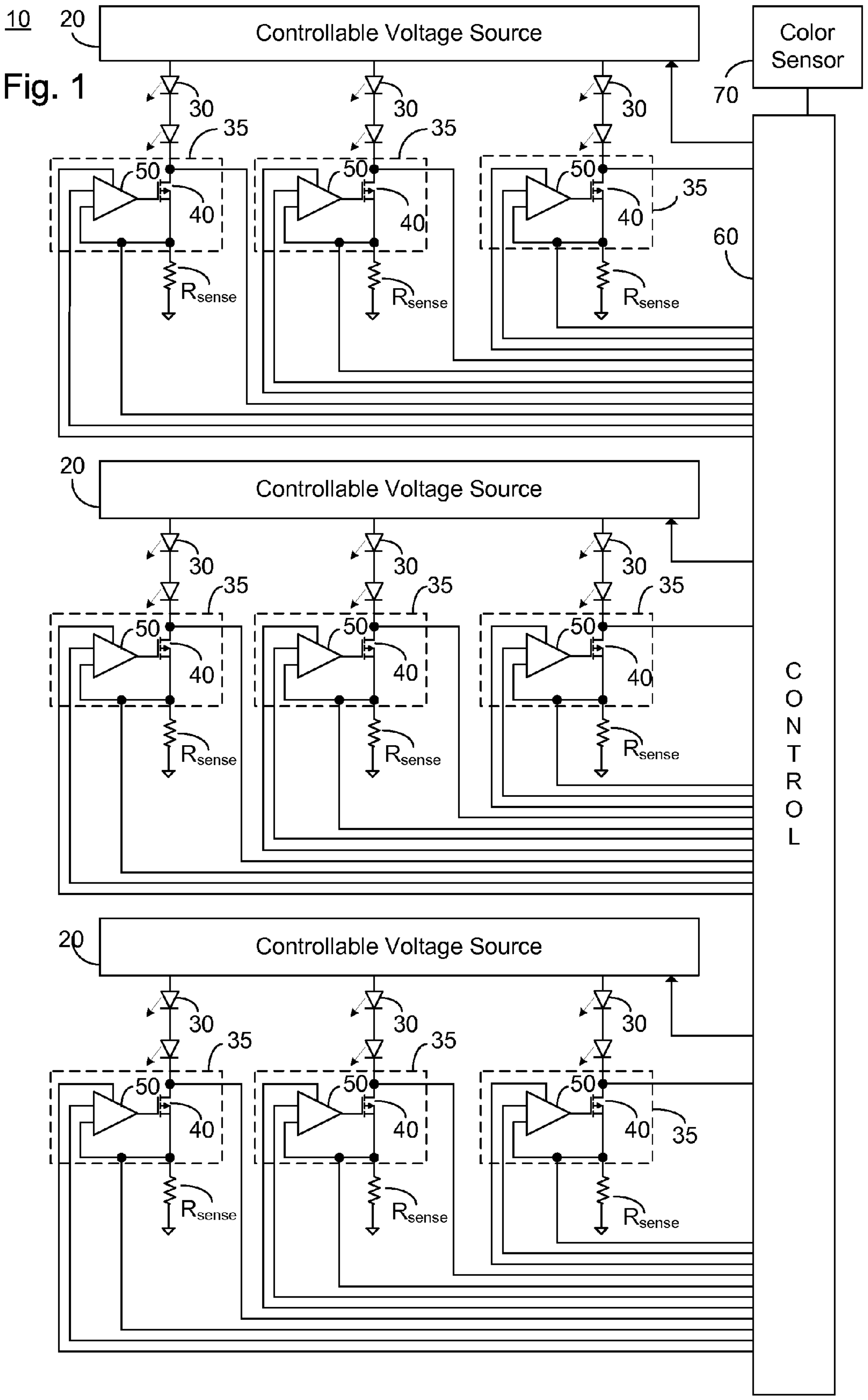
FIG. 1 illustrates a high level block diagram of a backlighting system exhibiting a separate controllable voltage source for each of a plurality of LED strings of a single color according to the principle of the invention.

The present embodiments enable a backlighting system exhibiting a plurality of LED strings, a plurality of current limiters each in series with a particular one of the plurality of LED strings, and a pulse width modulation functionality. The control circuitry is operative to monitor at least one thermal condition responsive to the plurality of current limiters, and in the event of a predetermined thermal condition, reduce the thermal stress by reducing the duty cycle of at least one of the plurality of LED strings.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level block diagram of a backlighting system 10 exhibiting a separate controllable voltage source 20 for each of a plurality of LED strings 30 of a single color according to the principle of the invention. System 10 further comprises: a plurality of current limiters 35 each comprising a FET 40 and a comparator 50; an LED string controller 60; a color sensor 70; and a plurality of sense resistors, denoted $R_{sense}$. LED string controller 60 is connected to receive an output of color sensor 70 and to control each controllable voltage source 20. A first end of each LED string 30 is connected to the controllable voltage source 20 associated therewith, and a second end is connected via FET 40 of the respective current limiter 35 and a respective $R_{sense}$ to ground. The gate of each FET 40 is connected to the output of the respective comparator 50. A first input of each comparator 50 is connected to the common point between the respective FET 40 and $R_{sense}$, and the second input of each comparator 50 is connected to a respective output of LED string controller 60. The enable input of each comparator 50 is connected to a respective output of LED string controller 60. An input of LED string controller 60 is connected to the common point between the respective FET 40 and $R_{sense}$ of each current limiter 35, and another input of LED string controller 60 is connected to the common point between the respective LED string 30 and FET 40 of each current limiter 35.

In operation, each current limiter 35 comprising a FET 40, a comparator 50 and receiving a voltage drop across $R_{sense}$ is arranged as a controllable current limiter, in which the current limit is set by the respective output of LED string controller 60. Color sensor 70 is operative to sense the color balance, i.e. the actual white point, of the output of the LED color strings 30, and output a signal responsive the luminance of the red, green and blue wavelengths experienced by color sensor 70. The enable input of each comparator 50 is arranged to disable or enable current through the respective FET 40, thereby enabling PWM control of the respective LED string 30 while maintaining a constant current when current is enabled. LED string controller 60, responsive to output of color sensor 70, is operative to adjust the PWM duty cycle of each of the respective LED strings 30 so as to maintain the desired white point. LED string controller 60 is arranged to enable voltage measurements across each FET 40 and $R_{sense}$ so as to enable a feedback loop to control each controllable voltage source 20 as will be explained further hereinto below.

System 10 has been illustrated and described in an embodiment in which only a single LED string 30 is arranged connected to a particular current limiter 35, however this is not meant to be limiting in any way. The use of a plurality of LED strings 30 connected to a particular current limiter is specifically included herein.

Advantageously, system 10 provides a separate PWM control for each LED string 30 in the system. Such a PWM control enables improved brightness control, color uniformity and average current accuracy since any inaccuracy in current control due to the action of current limiter 35 is compensatable by adjusting the appropriate PWM duty cycle. In one non-limiting example, inaccuracy in the value of a particular $R_{sense}$ is compensated for by adjusting the respective PWM duty cycle associated with the particular $R_{sense}$.

Figure 2:
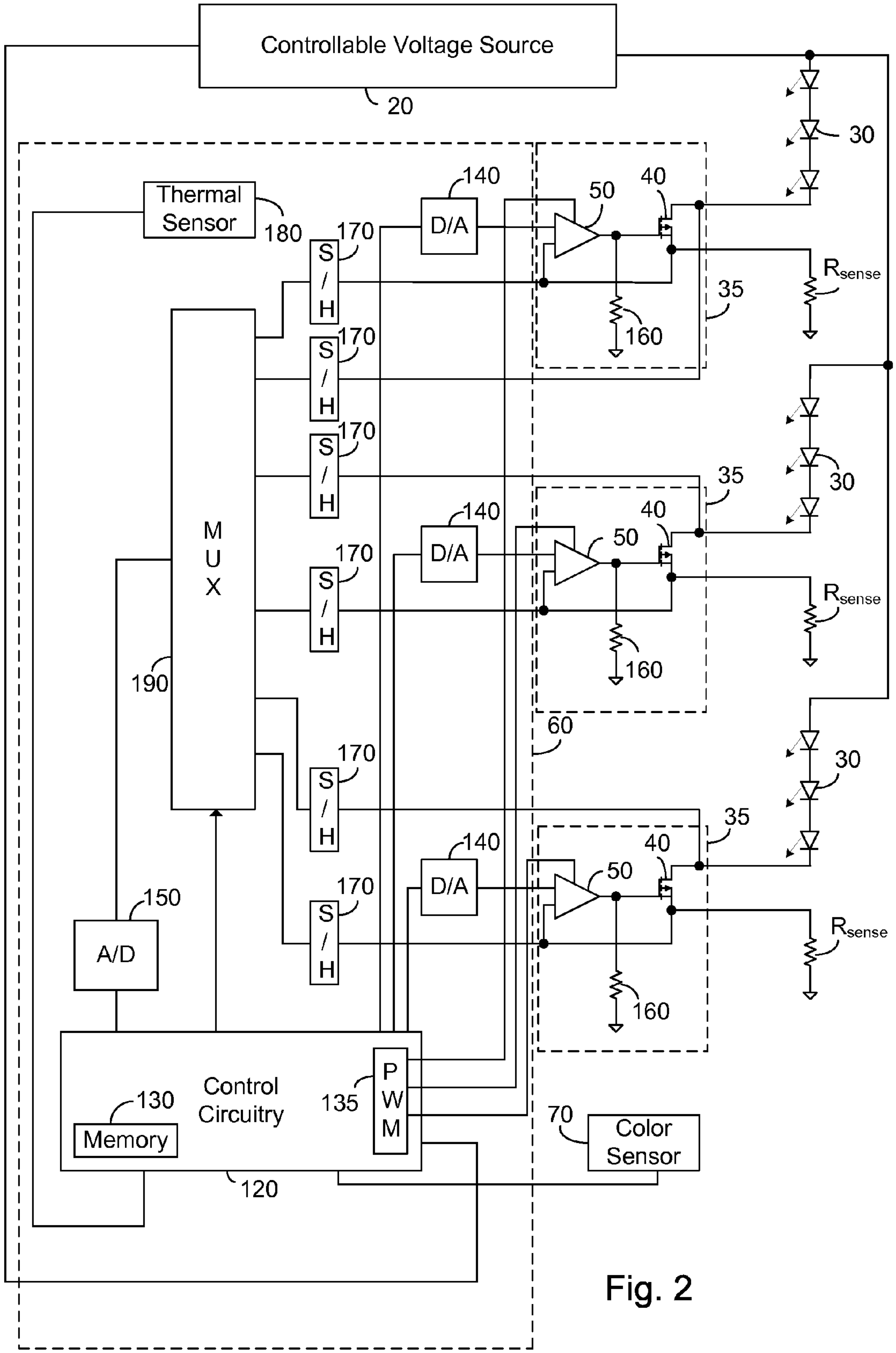
FIG. 2 illustrates a high level functional block diagram of an LED string controller, a plurality of current limiters, a controllable voltage source, a plurality of LED strings of a single color of the backlighting system of FIG. 1 and a color sensor according to a principle of the invention.

FIG. 2 illustrates a high level functional block diagram of an LED string controller 60, a controllable voltage source 20, a plurality of LED strings 30 of a single color, a plurality of current limiters 35 each associated with a respective LED string 30, a plurality of sense resistors $R_{sense}$ each associated with a respective LED string 30, and a color sensor 70 according to a principle of the invention. The configuration of FIG. 2 illustrates a plurality of LED strings of a single color used in an overall system in which a plurality of colors are used to produce a white light, as described above in relation to FIG. 1. Each current limiter 35 comprises an FET 40, a comparator 50 and a pull down resistor 160. LED string controller 60 comprises a control circuitry 120 comprising therein a memory 130 and a PWM functionality 135, a plurality of digital to analog (D/A) converters 140, an analog to digital (A/D) converter 150, a plurality of sample and hold (S/H) circuits 170, a thermal sensor 180 and a multiplexer 190. It is to be understood that all or part of the current limiters 35 may be constituted within LED string controller 60 without exceeding the scope of the invention. PWM functionality 135 preferably comprises a pulse width modulator responsive to control circuitry 120 operative to pulse width modulate the constant current through the respective LED string 30.

A first end of each LED string 30 is connected to a common output of controllable voltage source 20. A second end of each LED string 30 is connected to one end of current limiter 35 at the drain of the respective FET 40 and to an input of a respective S/H circuit 170 of LED string controller 60. The source of the respective FET 40 is connected to a first end of the respective sense resistor $R_{sense}$, and the second end of the respective $R_{sense}$ is connected to ground. The first end of the respective $R_{sense}$ is further connected to a first input of the respective comparator 50 of the respective current limiter 35 and to an input of a respective S/H circuit 170 of LED string controller 60. The gate of each FET 40 is connected to the output of the respective comparator 50 and to a first end of respective pull down resistor 160. A second end of each pull down resistor 160 is connected to ground.

A second input of each comparator 50 is connected to the output of a respective D/A converter 140 of LED string controller 60. The enable input of each comparator 50 is connected to a respective output of control circuit 120 associated with PWM functionality 135. Each D/A converter 140 is connected to a unique output of control circuitry 120, and the output of each S/H circuit 170 is connected to a respective input of multiplexer 190. The output of multiplexer 190, which is illustrated as an analog multiplexer, is connected to the input of A/D converter 150, and the digitized output of A/D converter 150 is connected to a respective input of control circuitry 120. The output of thermal sensor 180 is connected to a respective input of control circuitry 120 and the output of color sensor 70 is connected to a respective input of control circuitry 120. The S/H circuits 170 are preferably further connected (not shown) to receive from control circuitry 120 a timing signal so as to sample during the conduction portion of the respective PWM cycle responsive to PWM functionality 135. Color sensor 70 is associated with each of the plurality of colored LED strings 30, comprising strings of a plurality of colors, of which only a plurality of LED strings of a single color are illustrated.

Controllable voltage source 20 is shown as being controlled by an output of control circuitry 120, however this is not meant to be limiting in any way. A multiplexed analog feedback loop as will be described further hereinto below may be utilized without exceeding the scope of the invention.

In operation, control circuitry 120 enables operation of each of LED strings 30 via the operation of the respective current limiter 35, and initially sets the voltage output of controllable voltage source 20 to a minimum nominal voltage and each of the current limiters 35 to a minimum current setting. The current through each LED string 30 is sensed via a respective sense resistor $R_{sense}$, sampled and digitized via respective S/H circuit 170, multiplexer 190 and A/D converter 150 and fed to control circuitry 120. The voltage drop across each current limiter 35 is sampled and digitized via a respective S/H circuit 170, multiplexer 190 and A/D converter 150 and fed to control circuitry 120. Control circuitry 120 selects a particular one of the LED strings 30, or a function of the LED strings 30, and controls the output of controllable voltage source 20, as will be described further hereinto below, responsive to an electrical characteristic thereof. In one embodiment a LED string 30 is selected so as to minimize power dissipation, in another embodiment a LED string 30 is selected so as to ensure a precisely matching current in each of the LED strings 30, and in yet another embodiment a function of the LED strings 30 is selected as a compromise between precisely matched currents and minimized power dissipation. Control circuitry 120 further acts, as will be described further hereinto below, to compensate for aging when the PWM duty factor of respective current limiters 35 has reached a predetermined maximum by modifying the PWM duty factor of PWM functionality 135.

Control circuitry 120 further sets the current limit of the LED strings 30 to the same value, via a respective D/A converter 140. In particular FET 40, responsive to comparator 50, ensures that the voltage drop across sense resistor $R_{sense}$ is equal to the output of the respective D/A converter 140. Control circuitry 120 further acts to receive the output of color sensor 70, and modify the PWM duty cycle of the color strings 30 so as to maintain a predetermined white point and/or luminance. The PWM duty cycle is operated by the enabling and disabling of the respective comparator 50 under control of PWM functionality 135 of control circuitry 120.

In one embodiment, control circuitry 120 further inputs temperature information from one or more thermal sensors 180. In the event that one or more thermal sensors 180 indicate that temperature has exceeded a predetermined limit, control circuitry 120 acts to reduce power dissipation so as to avoid thermal overload. Optionally, control circuitry 120 further acts to increase a current limit value of the LED strings 30 to thereby at least partially compensate for said reduced duty cycle.

Figure 8:
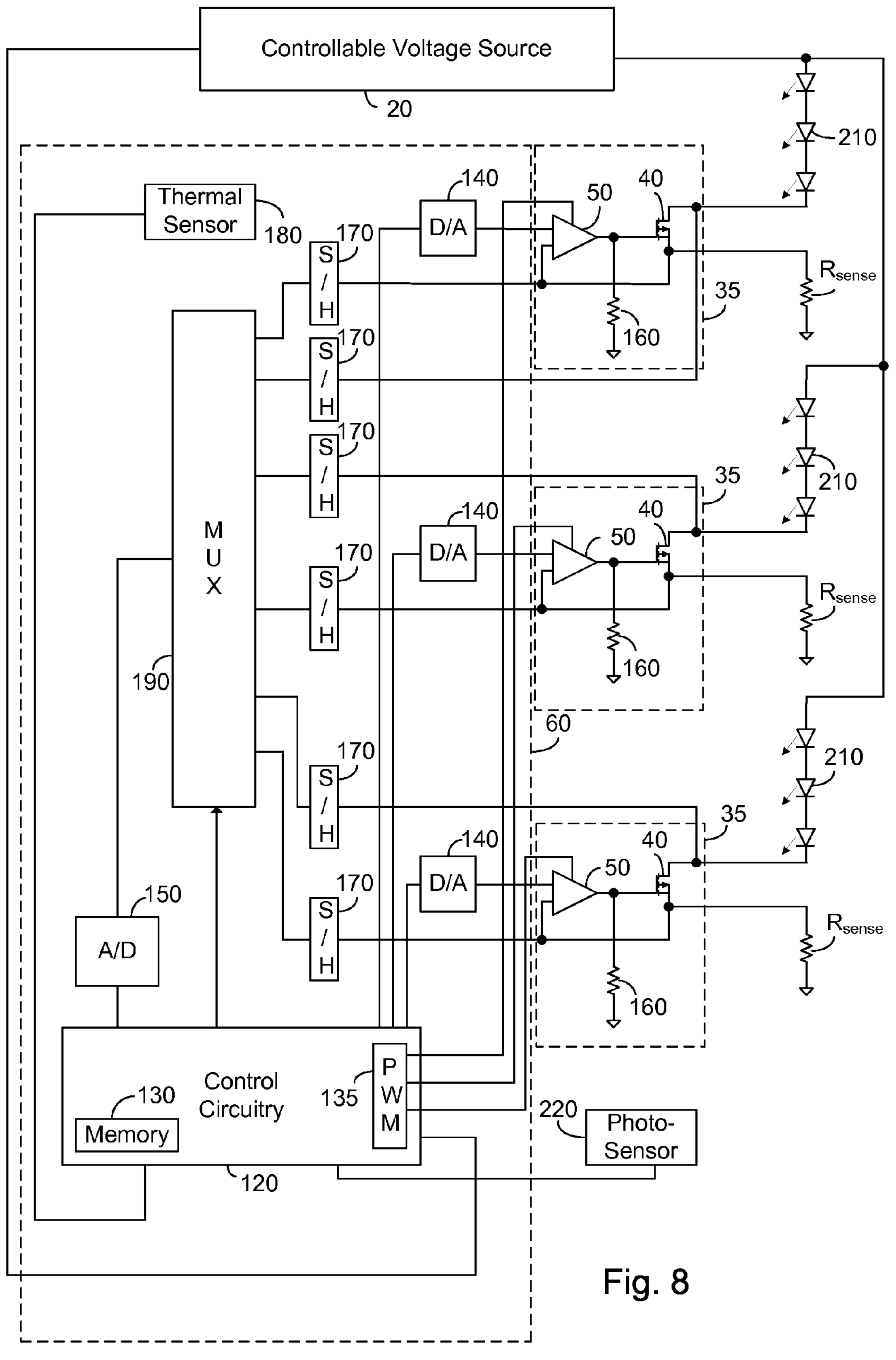
FIG. 8 illustrates a high level functional block diagram of an LED string controller, a plurality of current limiters, a controllable voltage source, a plurality of white LED strings and a photo-sensor according to a principle of the invention.

FIG. 8 illustrates a high level functional block diagram of an LED string controller 60, a controllable voltage source 20, a plurality of white LED strings 210, a plurality of current limiters 35 each associated with a respective white LED string 210, a plurality of sense resistors $R_{sense}$ each associated with a respective white LED string 210, and a photo-sensor 220 according to a principle of the invention. Each current limiter 35 comprises an FET 40, a comparator 50 and a pull down resistor 160. LED string controller 60 comprises a control circuitry 120 comprising therein a memory 130 and a PWM functionality 135, a plurality of digital to analog (D/A) converters 140, an analog to digital (A/D) converter 150, a plurality of sample and hold (S/H) circuits 170, a thermal sensor 180 and a multiplexer 190. It is to be understood that all or part of the current limiters 35 may be constituted within LED string controller 60 without exceeding the scope of the invention. PWM functionality 135 preferably comprises a pulse width modulator responsive to control circuitry 120 to pulse width modulate the constant current through the respective white LED string 210.

A first end of each white LED string 210 is connected to a common output of controllable voltage source 20. A second end of each white LED string 210 is connected to one end of current limiter 35 at the drain of the respective FET 40 and to an input of a respective S/H circuit 170 of LED string controller 60. The source of the respective FET 40 is connected to a first end of the respective sense resistor $R_{sense}$, and the second end of the respective $R_{sense}$ is connected to ground. The first end of the respective $R_{sense}$ is further connected to a first input of the respective comparator 50 of the respective current limiter 35 and to an input of a respective S/H circuit 170 of LED string controller 60. The gate of each FET 40 is connected to the output of the respective comparator 50 and to a first end of respective pull down resistor 160. A second end of each pull down resistor 160 is connected to ground.

A second input of each comparator 50 is connected to the output of a respective D/A converter 140 of LED string controller 60. The enable input of each comparator 50 is connected to a respective output of control circuit 120 associated with PWM functionality 135. Each D/A converter 140 is connected to a unique output of control circuitry 120, and the output of each S/H circuit 170 is connected to a respective input of multiplexer 190. The output of multiplexer 190, which is illustrated as an analog multiplexer, is connected to the input of A/D converter 150, and the digitized output of A/D converter 150 is connected to a respective input of control circuitry 120. The output of thermal sensor 180 is connected to a respective input of control circuitry 120 and the output of photo-sensor 220 is connected to a respective input of control circuitry 120. The S/H circuits 170 are preferably further connected (not shown) to receive from control circuitry 120 a timing signal so as to sample during the conduction portion of the respective PWM cycle responsive to PWM functionality 135.

Controllable voltage source 20 is shown as being controlled by an output of control circuitry 120, however this is not meant to be limiting in any way. A multiplexed analog feedback loop as will be described further hereinto below may be utilized without exceeding the scope of the invention.

In operation, control circuitry 120 enables operation of each of white LED strings 210 via the operation of the respective current limiter 35, and initially sets the voltage output of controllable voltage source 20 to a minimum nominal voltage and each of the current limiters 35 to a minimum current setting. The current through each of the LED strings 30 is sensed via a respective sense resistor $R_{sense}$, sampled and digitized via respective S/H circuit 170, multiplexer 190 and A/D converter 150 and fed to control circuitry 120. The voltage drop across current limiter 35 is sampled and digitized via a respective S/H circuit 170, multiplexer 190 and A/D converter 150 and fed to control circuitry 120. Control circuitry 120 selects a particular one of the LED strings 30, and controls the output of controllable voltage source 20, as will be described further hereinto below, responsive to the current flow through the selected LED string 30. In one embodiment the LED string 30 is selected so as to minimize power dissipation, in another embodiment the LED string 30 is selected so as to ensure a precisely matching current in each of the LED strings 30, and in yet another embodiment a function of the LED strings 30 is selected as a compromise between precisely matched currents and minimized power dissipation. Control circuitry 120 further acts, as will be described further hereinto below to compensate for aging when the PWM duty factor of respective current limiters 35 has reached a predetermined maximum by modifying the PWM duty factor of PWM functionality 135.

Control circuitry 120 further sets the current limit of the LED strings 120 to the same value, via a respective D/A converter 140. In particular FET 40 responsive to comparator 50 ensures that the voltage drop across sense resistor $R_{sense}$ is equal to, or less than, the output of the respective D/A converter 140. Control circuitry 120 further acts to receive the output of photo-sensor 220, and modify the PWM duty cycle of white LED strings 210 so as to maintain a predetermined intensity. The PWM duty cycle is operated by the enabling and disabling of the respective comparator 50 under control of PWM functionality 135 of control circuitry 120.

In one embodiment, control circuitry 20 further inputs temperature information from one or more thermal sensors 180. In the event that one or more thermal sensors 180 indicate that temperature has exceeded a predetermined limit, control circuitry 120 acts to reduce power dissipation so as to avoid thermal overload. Optionally, control circuitry 120 further acts to increase a current limit value of the LED strings 30 to thereby at least partially compensate for said reduced duty cycle.

Figure 3:
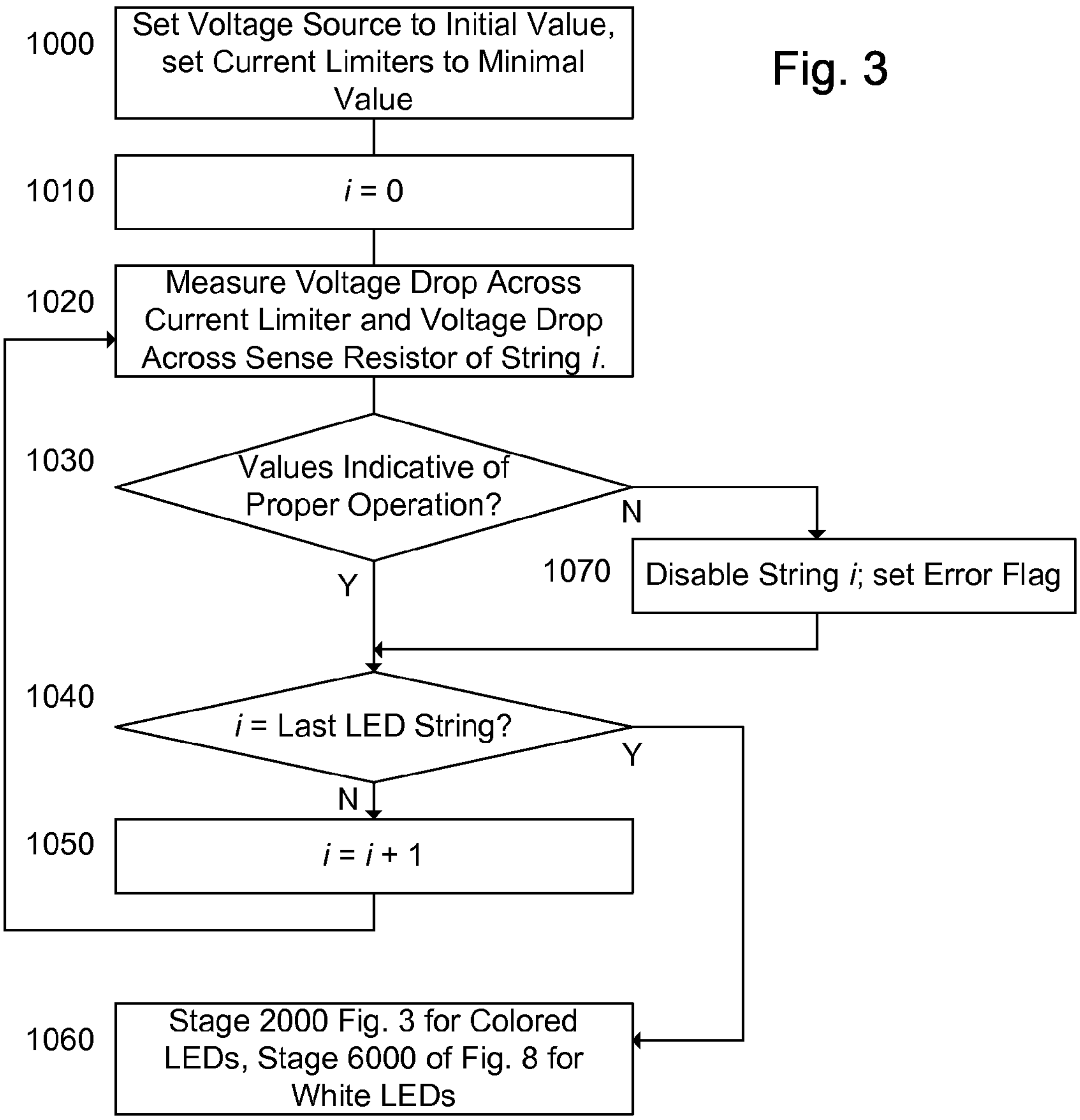
FIG. 3 illustrates a high level flow chart of the operation of the LED string controller of FIGS. 1, 2 to test the LED strings prior to full operation according to a principle of the invention.

FIG. 3 illustrates a high level flow chart of the operation of LED string controller 60 of FIGS. 1, 2 and 8 to test respective LED strings 30, 210 prior to full operation according to a principle of the invention. In stage 1000, the voltage source is set to an initial value and each of the current limiters 35 are set to a minimal value. Thus, in the event of a short circuit, system 10 is current limited and will not be damaged. In stage 1010 an LED string counter, i, is initialized to zero.

In stage 1020 the voltage drop across each current limiter 35, i.e. across the respective FET 40, is measured and the actual voltage drop representative of the current flow through the respective LED string 30, 210 is measured for string i. In stage 1030 the values input are compared to prestored minimum safe values, thereby checking whether LED string, i, is safe to be fully enabled. For example in the event that no current is sensed an error condition may be flagged. In the event an excess current condition across sense resistor $R_{sense}$ is measured, a short circuit condition may be flagged and, as will be described further, the LED string, i, is not to be enabled.

In the event that in stage 1030 the measured values associated with LED string, i, are indicative of proper operation, in stage 1040 index i is checked to see if it represents the last LED string. In the event that index i does not represent the last LED string, in stage 1050 the index i is incremented and stage 1020 as described above is again performed.

In the event that in stage 1040 index i represents the last LED string, thus all LED strings have been checked for values indicative of proper operation, in stage 1060, stage 2000 of FIG. 4 in an embodiment of a plurality of colors, or stage 6000 of FIG. 9 in an embodiment of white LEDs, as will be described further hereinto below, is performed. In the event that in stage 1030 the measured values associated with LED string i are not indicative of proper operation, in stage 1070, LED string i is disabled and preferably an error flag is set. Stage 1040 as described above is then performed.

Figure 4:
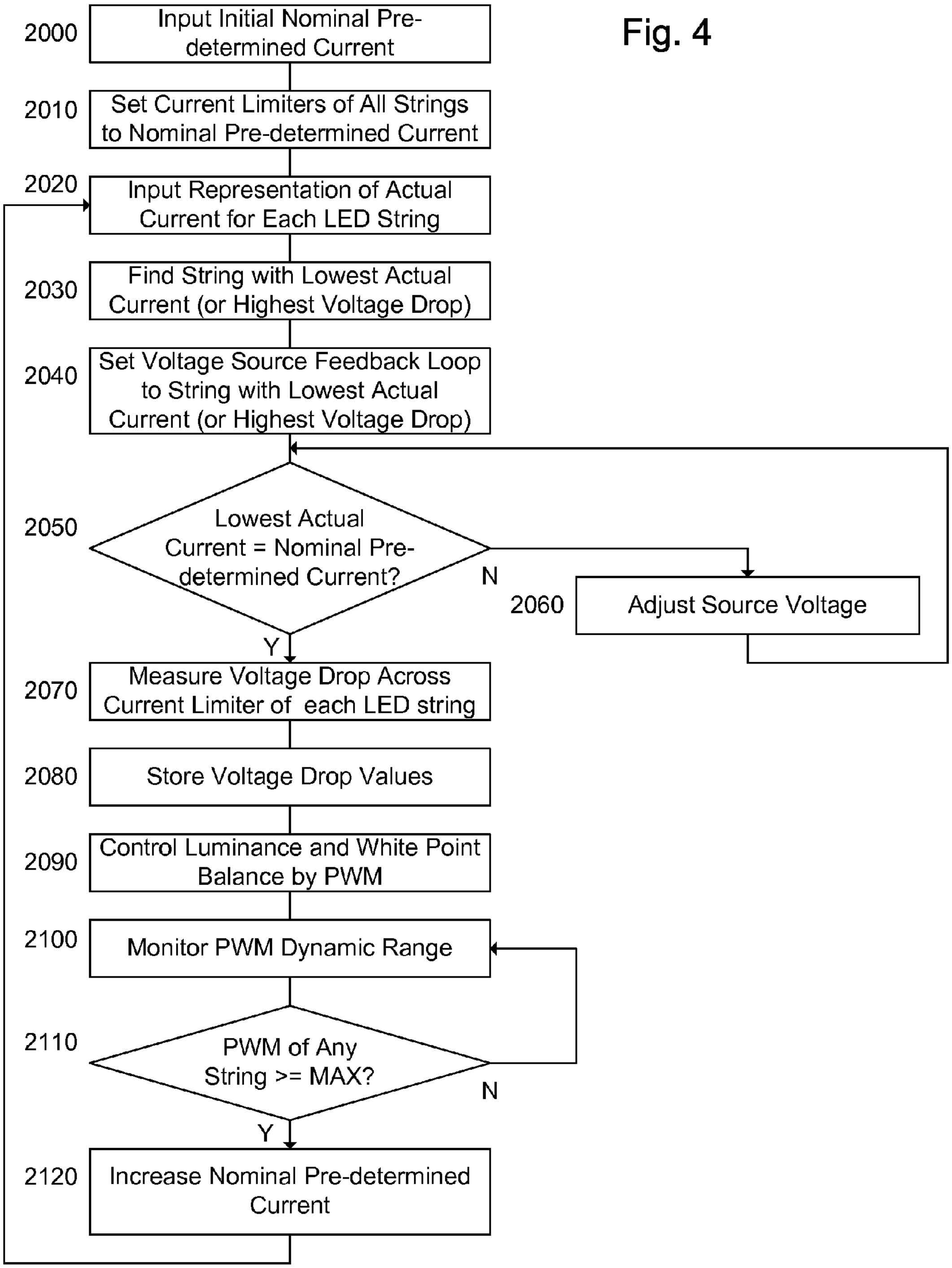
FIG. 4 illustrates a high level flow chart of the operation of the LED string controller of FIGS. 1, 2 to control the voltage of the controllable voltage source so as to minimize excess power dissipation while ensuring a balanced current flow through each of the LED strings of the same color, and to further monitor the PWM dynamic range and increase the current flow through the LEDs when the PWM duty cycle has reached a predetermined maximum according to a principle of the invention.

FIG. 4 illustrates a high level flow chart of the operation of the LED string controller 60 of FIGS. 1, 2 to control the voltage output of controllable voltage source 20 so as to minimize excess power dissipation while ensuring a balanced current flow through each of the LED strings 30 of the same color, and to further monitor the PWM dynamic range and increase the current flow through the LED strings 30 when the PWM duty cycle has reached a predetermined maximum according to a principle of the invention. In stage 2000, the initial nominal predetermined current for each of the LED strings 30 is input. In an exemplary embodiment the plurality of LED strings 30 of the same color have the same predetermined current. Preferably the initial nominal predetermined current is stored in a non-volatile portion of memory 130. In stage 2010, current limiters 35 associated with each of the LED strings 30 are set to the nominal predetermined current input in stage 2000.

In stage 2020 a representation of the actual current through each of the LED strings 30 is input. In one embodiment the representation is a digitized measurement of the voltage drop across the respective $R_{sense}$ of each LED string as described above. In another embodiment the representation is a digitized measurement of the voltage drop from the drain of FET 40 to ground of each LED string as described above. In yet another embodiment the representation is a two dimensional filter of the voltage drop across $R_{sense}$ and the voltage from the drain of FET 40 to ground. Such a filter, which may be implemented digitally, in one embodiment take n samples of the voltage from the drain of FET 40 to ground, and adds to it to a weighted measurement of the voltage drop across $R_{sense}$. The weighted average is compared to a reference indicative of the expected value. The use of the weighted average reduces noise in the measurement.

In stage 2030 the LED string 30 of each color exhibiting the lowest actual current as input in stage 2020 is identified. As described above, the lowest actual current corresponds with the LED string 30 exhibiting the greatest voltage drop. In the embodiment in which the voltage from drain to ground is utilized for stage 2020, the minimum voltage drop is selected. It is to be understood that the minimum voltage drop is equivalent to the maximum voltage drop across the respective LED string 30.

In stage 2040 the feedback loop to controllable voltage source 20 is set to sense resistor $R_{sense}$ of the LED string 30 identified in stage 2030. In the embodiment in which the voltage from the drain of FET 40 to ground, or a filtered component thereof, is utilized, the feedback loop to controllable voltage source 20 is set to the FET 40 exhibiting the lowest voltage drop from the drain of FET 40 to ground.

In stage 2050 the actual current of the LED string 30 identified in stage 2030 is compared with the nominal predetermined current of stage 2000 or stage 2120 described below. In the event that the actual current of the LED string 30 identified in stage 2030 is not equal to the nominal predetermined current of stage 2000 or stage 2120 described below, in stage 2060 the controllable voltage source 20 is adjusted and stage 2050 is again performed. The feedback loop from the actual current of the LED string 30 to the controllable voltage source 20 may be digitally implemented or implemented by analog electronics, or a combination thereof, in which the actual measured value is compared to the predetermined reference value reflective of the nominal predetermined current, and any difference is fed as a correction to controllable voltage source 20. In an embodiment in which the voltage from the drain of FET 40 to ground, or a filtered component thereof, is utilized the reference for the feedback loop is a calculated value which will provide the nominal predetermined current and enable proper operation of the current limiters 35. Hysteresis as required may be added into stages 2050 and 2060 without exceeding the scope of the invention.

In the event that in stage 2050 the actual current of the LED string 30 identified in stage 2030 is equal to the nominal predetermined current of stage 2000 or stage 2120 described below, in stage 2070 the voltage drop across each current limiter 35, i.e. the voltage drop across FET 40 is measured and in stage 2080 the measured voltage drop is stored in memory 130. As will be described further below a sudden change in voltage drop is advantageously used to identify a failure of one or more LEDs in an LED string 30.

In stage 2090 the overall luminance and white point is controlled, responsive to color sensor 70, by modifying the PWM duty cycle of each of the LED strings 30 as is known to those skilled in the art and is further described in U.S. Pat. No. 6,127,783 issued Oct. 3, 2000 to Pashley and U.S. Pat. No. 6,441,558 issued Aug. 27, 2002 to Muthu, the entire contents of both of which are incorporated herein by reference. Preferably the timing of the PWM duty cycle of PWM functionality 135 is controlled to balance out the load on each of the controllable voltage sources 20. The prior art teaches staggering the start time of each string so as to reduce electromagnetic interference, and the subject invention further staggers the start time so as to balance the load.

In stage 2100 the PWM dynamic range utilized in the operation of stage 2090 is monitored. In stage 2110 the dynamic range of stage 2100 is compared with a predetermined maximum. It is known that due to aging of the LEDs the overall luminance decreases, and stage 2090 at least partially compensates for the aging by adjusting the PWM duty cycle of PWM functionality 135 to maintain the overall luminance while maintaining the predetermined white point. Stage 2110 detects when the increase of the PWM duty cycle has reached a predetermined maximum. In one embodiment the PWM duty cycle maximum is 95%. In the event that in stage 2110 the PWM duty cycle has not reached the maximum, stage 2100 is performed as described above.

In the event that in stage 2110 the PWM duty cycle for any of the LED strings has reached the predetermined maximum, in stage 2120 the nominal predetermined current is increased. In one embodiment the current of the color LED string 30 whose PWM duty cycle has reached a maximum is increased, and in another embodiment the current of all LED strings 30 are increased. Thus, the luminance of the LEDs is increased without any requirement to further increase the PWM duty cycle. In one embodiment the nominal predetermined current is increased so as to reduce the PWM duty cycle to a predetermined nominal value. In another embodiment the nominal predetermined current is increased by a predetermined amount. Stage 2020 is again performed as described above thereby resetting the outputs of controllable voltage source 20 in line with the newly set nominal predetermined current.

Figure 9:
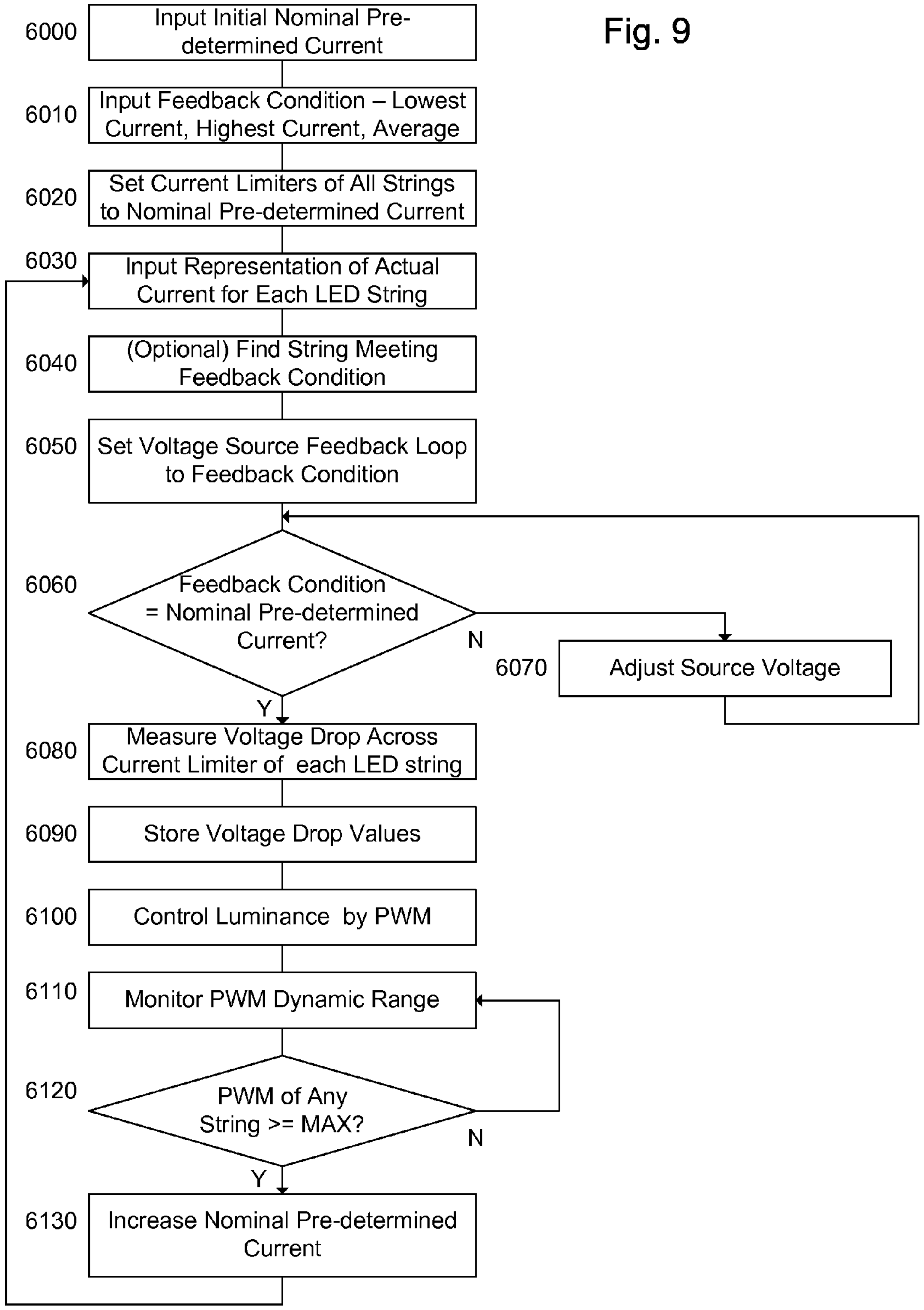
FIG. 9 illustrates a high level flow chart of the operation of the LED string controller of FIG. 8 to select a particular LED string, or a function of the LED strings, to feedback for control of the controllable voltage source, and to further monitor the PWM dynamic range and increase the current flow through the LEDs when the PWM duty cycle has reached a predetermined maximum according to a principle of the invention.

FIG. 9 illustrates a high level flow chart of the operation of the LED string controller of FIG. 8 to select a particular white LED string 210, or a function of the LED strings 210, to feedback for control of controllable voltage source 20, and to further monitor the PWM dynamic range and increase the current flow through white LED strings 210 when the PWM duty cycle has reached a predetermined maximum according to a principle of the invention. In stage 6000, the initial nominal predetermined current for each of the white LED strings 210 is input. Preferably the initial nominal predetermined current is stored in a non-volatile portion of memory 130. In stage 6010 the feedback condition is input, preferably from a host (not shown).

In one embodiment the selected feedback condition is the lowest current, as described above in relation to the method of FIG. 4, thereby ensuring a nearly identical current flow through each of white LED strings 210 due the current limiting action of current limiters 35.

In another embodiment, the selected feedback condition is the highest current, thereby ensuring a minimum power dissipation of the system of FIG. 8, because the voltage output of controllable voltage source 20 will be set at a lower output responsive to the lower voltage drop of the highest current white LED string 210 and less power will be dissipated across current limiters 35. It is to be understood that the balance of white LED strings 210 may exhibit a current less than the nominal current, and thus may not produce an identical luminance to that of the selected highest current white LED string 210. In one embodiment, binning of the white LED strings 210, or more particularly of the white LEDs constituting white LED strings 210, ensures that the difference is within tolerance. In another embodiment the need for reduced power consumption is considered more significant than the irregularity of the overall luminance of the backlight.

In yet another embodiment, the selected feedback condition is an average current, which may be one of: the mean current of the white LED strings 210; the white LED string 210 exhibiting a current closest to the average between the maximum current white LED string 210 and the minimum current white LED string 210; and a calculated average of the currents through the white LED strings 210. Use of the average current represents a compromise between minimum power consumption and precision balance between the current of the white LED strings 210.

In yet another embodiment, the selected feedback condition is a function of the currents in the various LED strings.

In stage 6020, the current limiters 35 of each of the white LED strings 210 are set to the nominal predetermined current input in stage 6000. In stage 6030 a representation of the actual current through each of the white LED strings 210 is input. In one embodiment the representation is a digitized measurement of the voltage across the respective $R_{sense}$ of each LED string 210 as described above. In another embodiment the representation is a digitized measurement of the voltage drop from the drain of FET 40 to ground. In yet another embodiment the representation is a two dimensional filter of the voltage drop across $R_{sense}$ and the voltage drop from the drain of FET 40 to ground. Such a filter, which may be implemented digitally, in one embodiment take n samples of the voltage from voltage drop across FET 40, and adds to it to a weighted measurement of the voltage drop across $R_{sense}$. The weighted average is compared to a reference indicative of the expected value. The use of the weighted average reduces noise in the measurement.

In stage 6040 the white LED string 210 meeting the feedback condition of stage 6010 is found. In an embodiment in which a calculated average current is utilized, as describe above in relation to stage 6010, stage 6040 is not implemented. Stage 6040 is thus illustrated as optional.

In stage 6050 the feedback loop to controllable voltage source 20 is set in accordance with the feedback condition of stage 6010, in cooperation with optional stage 6040. Thus, in the event a particular white LED string 210 meets the feedback condition, one of the voltage drop across sense resistor $R_{sense}$ of the particular white LED string 210 identified in stage 6040 and the voltage drop from the drain of FET 40 to ground of the particular white LED string 210 identified in stage 6040, or a filtered combination thereof, is set to be fed back to control the voltage output of controllable voltage source 20. In an embodiment in which a function of the currents are utilized, such as a calculated average as described above, the feedback loop is set to the output of the average current of the white LED strings 210.

In stage 6060 the actual current of feedback condition, whether a particular white LED string 210 identified in stage 6040, or a function of a plurality of white LED strings 210 such as an average, is compared with the nominal predetermined current of stage 6000. In the event that the actual current of the white LED string 210 identified in stage 6040, or the function of the plurality of white LED strings 210, is not equal to the nominal predetermined current, in stage 6070 the controllable voltage source 20 is adjusted and stage 6060 is again performed. The feedback loop from the actual current of the particular white LED string 210, or the function of the plurality of white LED strings 210 to the controllable voltage source 20 may be digitally implemented or implemented by analog electronics, or a combination thereof, in which the actual measured value is compared to the predetermined reference value equivalent to the nominal predetermined current, and any difference is fed as a correction to controllable voltage source 20. In an embodiment in which the voltage from the drain of FET 40 to ground, or a filtered component thereof, is utilized, the reference for the feedback loop is a calculated value which will provide the nominal predetermined current and enable proper operation of the current limiters 35. Hysteresis as required may be added into stages 6060 and 6070 without exceeding the scope of the invention.

In the event that in stage 6060 the actual current of the white LED string 210 identified in stage 6040, or the function of the plurality of white LED strings 210, is equal to the nominal predetermined current, in stage 6080 the voltage drop across each current limiter 35, i.e. the voltage drop across FET 40 is measured and in stage 6090 the measured voltage drop is stored in memory 130. As will be described further below a sudden change in voltage drop is advantageously used to identify a failure of one or more LEDs in a white LED string 210.

In stage 6100 the overall luminance is controlled, responsive to photo-sensor 220, by modifying the PWM duty cycle of each of the white LED strings 210 as is known to those skilled in the art to achieve the desired overall luminance. Preferably the timing of the PWM duty cycle of PWM functionality 135 is controlled to balance out the load on the controllable voltage sources 20. The prior art teaches staggering the start time of each string so as to reduce electromagnetic interference, and the subject invention further staggers the start time so as to balance the load.

In stage 6110 the PWM dynamic range utilized in the operation of stage 6100 is monitored. In stage 6120 the dynamic range monitored in stage 6110 is compared with a predetermined maximum. It is known that due to aging of the LEDs the overall luminance decreases, and stage 6100 at least partially compensates for the aging by adjusting the PWM duty cycle of PWM functionality 135 to maintain the overall luminance. Stage 6120 detects when the increase of the PWM duty cycle has reached a predetermined maximum. In one embodiment the PWM duty cycle maximum is 95%. In the event that in stage 6120 the PWM duty cycle has not reached the maximum, stage 6110 is performed as described above.

In the event that in stage 6120 the PWM duty cycle for any of the white LED strings 210 has reached the predetermined maximum, in stage 6130 the nominal predetermined current is increased. Thus, the luminance of the LEDs is increased without any requirement to further increase the PWM duty cycle. In one embodiment the nominal predetermined current is increased so as to reduce the PWM duty cycle to a predetermined nominal value. In another embodiment the nominal predetermined current is increased by a predetermined amount. Stage 6030 is again performed as described above thereby resetting the outputs of controllable voltage source 20 in line with the newly set nominal predetermined current.

The above has been described in an embodiment of white LEDs 210 of FIG. 8, however this is not meant to be limiting in any way. The plurality of potential feedback conditions responsive to an electrical characteristic of at least one LED string is equally applicable to colored LED strings 30 of FIGS. 1, 2 without exceeding the scope of the invention.

Figure 5:
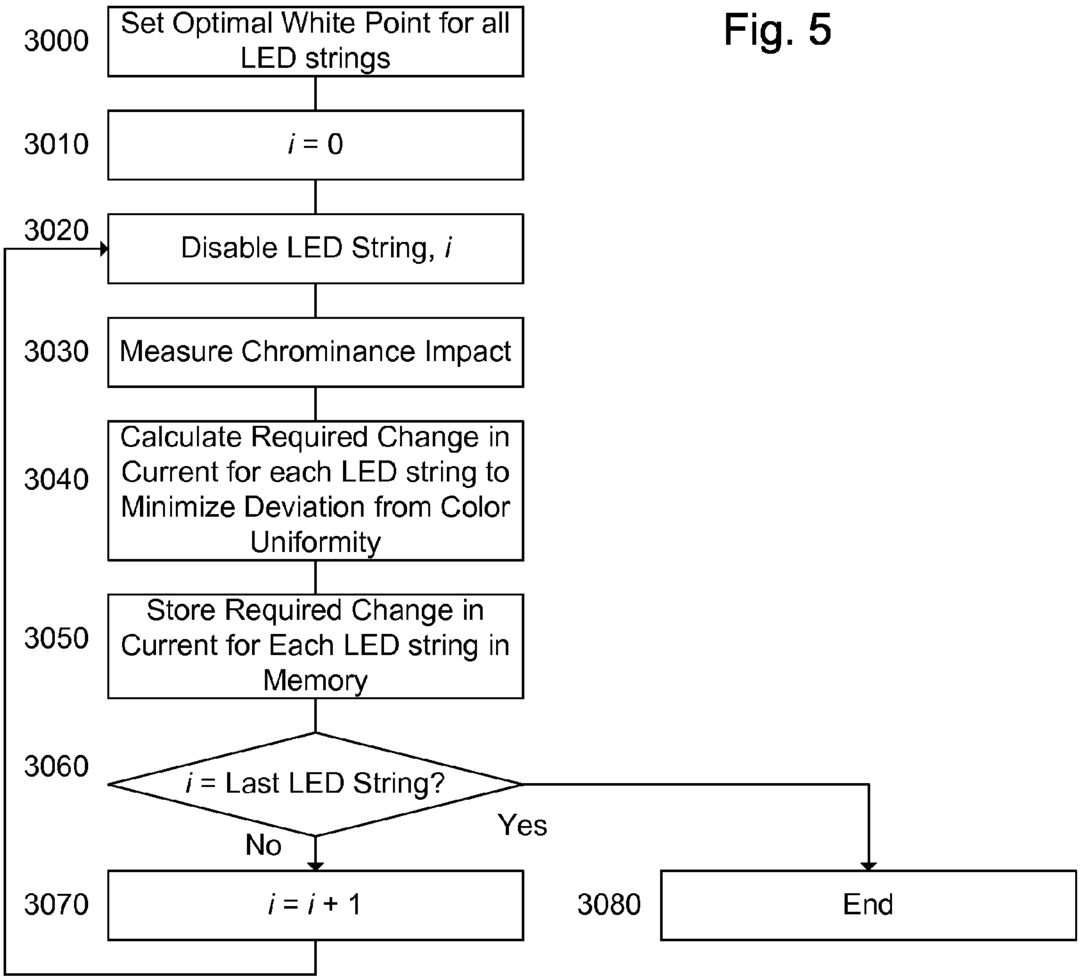
FIG. 5 illustrates a high level flow chart of an initialization operation for the LED string controller of FIGS. 1, 2 and 8 to measure the chrominance impact of a failure of each of the LED strings, calculate the required change in current to compensate for the failure and store the changes according to a principle of the invention.

FIG. 5 illustrates a high level flow chart of an initialization operation for the LED string controller of FIGS. 1, 2 and 8 to measure the chrominance impact of a failure of each of the LED strings, calculate the required change in current to compensate for the failure and store the changes according to a principle of the invention. In one embodiment the operation of FIG. 5 is performed as part of a manufacturing or a calibration stage. In another embodiment the operation of FIG. 5 is performed on at least one sample and the results used for a plurality of units which have not performed the operation of FIG. 5.

In stage 3000 a desired white point is achieved by setting a constant current for each of the LED strings. In one embodiment the constant current setting achieving the desired white point used is the initial nominal predetermined current of stage 2000 of FIG. 4 or 6000 of FIG. 9. It is to be understood that in an embodiment of white LEDs, such as LED strings 210 of FIG. 8, a uniform luminance is desired instead of a white point. In stage 3010 an LED string counter, i, is initialized to zero.

In stage 3020 the LED string indicated by the LED string counter i is disabled. In one embodiment this is accomplished by disabling comparator 50 of current limiter 35 associated with LED string i. Preferably the feedback loop from respective color sensor 70, photo-sensor 220 is disabled so as to prevent LED string controller 60 from attempting to correct for the disabled LED string i responsive to the input from respective color sensor 70, photo-sensor 220. In stage 3030 the chrominance and/or luminance impact on the LCD monitor is measured. In one embodiment this is measured at a plurality of points on the LCD monitor face.

In stage 3040 the required current change for the remainder of the LED strings that will succeed in minimizing deviation from color uniformity is calculated. Preferably the required current change is further determined so as to minimize the deviation from the desired white point. In one embodiment minimized deviation results in a uniform display exhibiting a white point within a predetermined range of the initial set white point. In another embodiment minimized deviation results in a plurality of white points across the display exhibiting white points within a predetermined range of the initial set white point however the white point is not uniform. The required current changes for the balance of the LED strings 30, 210 may be calculated or alternatively an optimization algorithm may be utilized. In an embodiment of white LED strings 210, the required current change that will succeed in minimizing deviation from luminance uniformity is calculated.

In stage 3050 the required current changes as determined in stage 3040 are stored in a non-volatile portion of memory 130 of FIG. 2. The above is described as having the difference in current required for each LED string stored, so as to enable minimizing the deviation irrespective of the nominal set current, however this is not meant to be limiting in any way. In an alternative embodiment a fixed initial nominal set current is used, and current values required to minimize the deviation are determined and stored by stages 3040-3050.

In stage 3060 index i is checked to see if it represents the last LED string 30. In the event that index i does not represent the last LED string, in stage 3070 the index is incremented and stage 3020 as described above is again performed. In the event that in stage 3060 index i does represent the last LED string, thus all LED strings have been disabled and the current changes to achieve a minimized deviation have been determined and stored, in stage 3080 the routine ends.

Figure 6A:
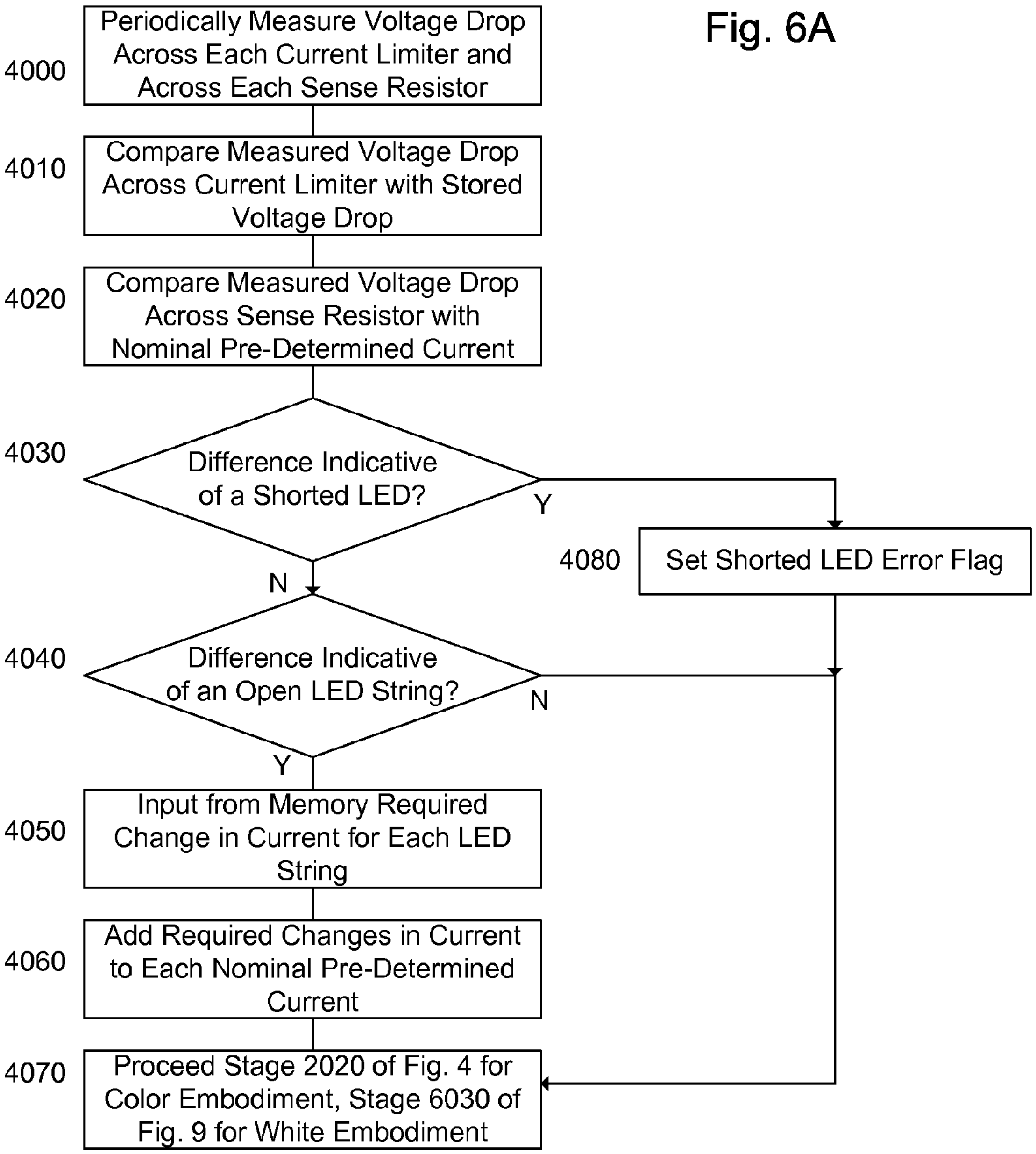
FIG. 6A illustrates a high level flow chart of the operation of the LED string controller of FIGS. 1, 2 and 8 to periodically check the voltage drop across each of the current limiters and the actual current flow through the LED strings so as to detect one of a short circuited LED and an open circuited LED string, set an error flag in the event that a short circuited LED has been detected, adjust the current of the remaining strings to compensate for the open LED string in accordance with the stored values of FIG. 5 and renter the high level flow chart of FIG. 4 so as to update the control of the controllable voltage source according to a principle of the invention.

FIG. 6A illustrates a high level flow chart of the operation of LED string controller 60 of FIGS. 1, 2 and 8 to periodically check the voltage drop across each of the current limiters 35 and the actual current flow through the LED strings 30 so as to detect one of a short circuited LED and an open circuited LED string 30, set an error flag in the event that a short circuited LED has been detected, adjust the current of the remaining strings to compensate for the open LED string 30 in accordance with the stored values of FIG. 5 and renter the high level flow chart of FIG. 4, or FIG. 9 respectively, so as to update the control of the controllable voltage source according to a principle of the invention.

In stage 4000 the voltage drop across each of the current limiters 35 and the voltage drop across each of the sense resistors $R_{sense}$ are periodically measured and stored. The voltage drop across $R_{sense}$ is representative of the current flow through the associated LED string 30, 210 and the voltage drop across each current limiter 35, i.e. across FET 40, is indicative of the status of the current limiter, i.e. it is representative of the power dissipation across the current limiter 35. In stage 4010 the voltage drop across each current limiter 35 is compared with the voltage drop stored in memory 130 according to stage 2080 of FIG. 4 or 6090 of FIG. 9, respectively, and with the previous value stored by an earlier instance of stage 4000. In stage 4020 the voltage drop across each sense resistor $R_{sense}$ is compared with the expected voltage drop determined according to the nominal predetermined current and the known value of $R_{sense}$.

In stage 4030 the differences of stages 4010 and 4020 are analyzed to see if the difference is indicative of a shorted LED within a particular LED string 30, 210. For example, a short circuit of a single LED in an LED string 30, 210 will result in a sudden increase from a previous reading in the voltage drop across the particular current limiter 35 associated with the LED string 30, 210 exhibiting the short circuited LED. In the event that the difference in voltage drops of stages 4010 and 4020 are not indicative of short circuited LED in an LED string 30, 210 in stage 4040 the differences of stages 4010 and 4020 are analyzed to see if the difference is indicative of an open circuited LED within a particular LED string 30, 210. An open circuited LED within a particular LED string 30, 210 results in a disabled LED string 30, 210 in which no current is sensed by sense resistor $R_{sense}$.

In the event that the difference in voltage drops of stages 4010 and 4020 are indicative of an open circuited LED in an LED string 30, 210 in stage 4050 the required changes in current for each LED string other than the open circuited LED string 30, 210 previously stored in stage 3050 of FIG. 5, is input from memory 130. In stage 4060 the change in current of stage 4050 is added to the nominal predetermined current for each LED string 30, 210. Thus, the nominal predetermined current of each LED string is modified by the stored changes, or in an alternative embodiment set to respective stored compensating values, and stage 2020 of FIG. 4 for an embodiment of colored LEDs, or stage 6030 of FIG. 9 for an embodiment of white LEDs, respectively, is performed to adjust controllable voltage source 20 in accordance with the adjusted nominal predetermined current.

In the event that in stage 4040 the difference in voltage drops of stages 4010 and 4020 are not indicative of an open circuited LED in an LED string 30, 210 stage 2020 of FIG. 4 or stage 6030 of FIG. 9 for an embodiment of white LEDs, respectively, is performed so as to again determine the lowest actual current string and close the feedback loop with controllable voltage source 20 accordingly.

In the event that in stage 4030 the difference in voltage drops of stages 4010 and 4020 are indicative of short circuited LED in an LED string 30, 210 in stage 4080 an error flag indicative of a short circuited LED and indicating the particular LED string 30, 210 in which the short circuited LED has been detected is set. Stage 2020 of FIG. 4 for an embodiment of colored LEDs, or stage 6030 of FIG. 9 for an embodiment of white LEDs, respectively, is performed to adjust controllable voltage source 20 in accordance with the adjusted nominal predetermined current.

The above has been described in an embodiment in which both the voltage drop across $R_{sense}$ and the voltage drop across the current limiters 35 are both input and compared, however this is not meant to be limiting in any way. One of the voltage drop across $R_{sense}$ and the voltage drop across the current limiters 35 may be utilized, or a combination of the two may be utilized in a single function, without exceeding the scope of the invention.

Figure 6B:
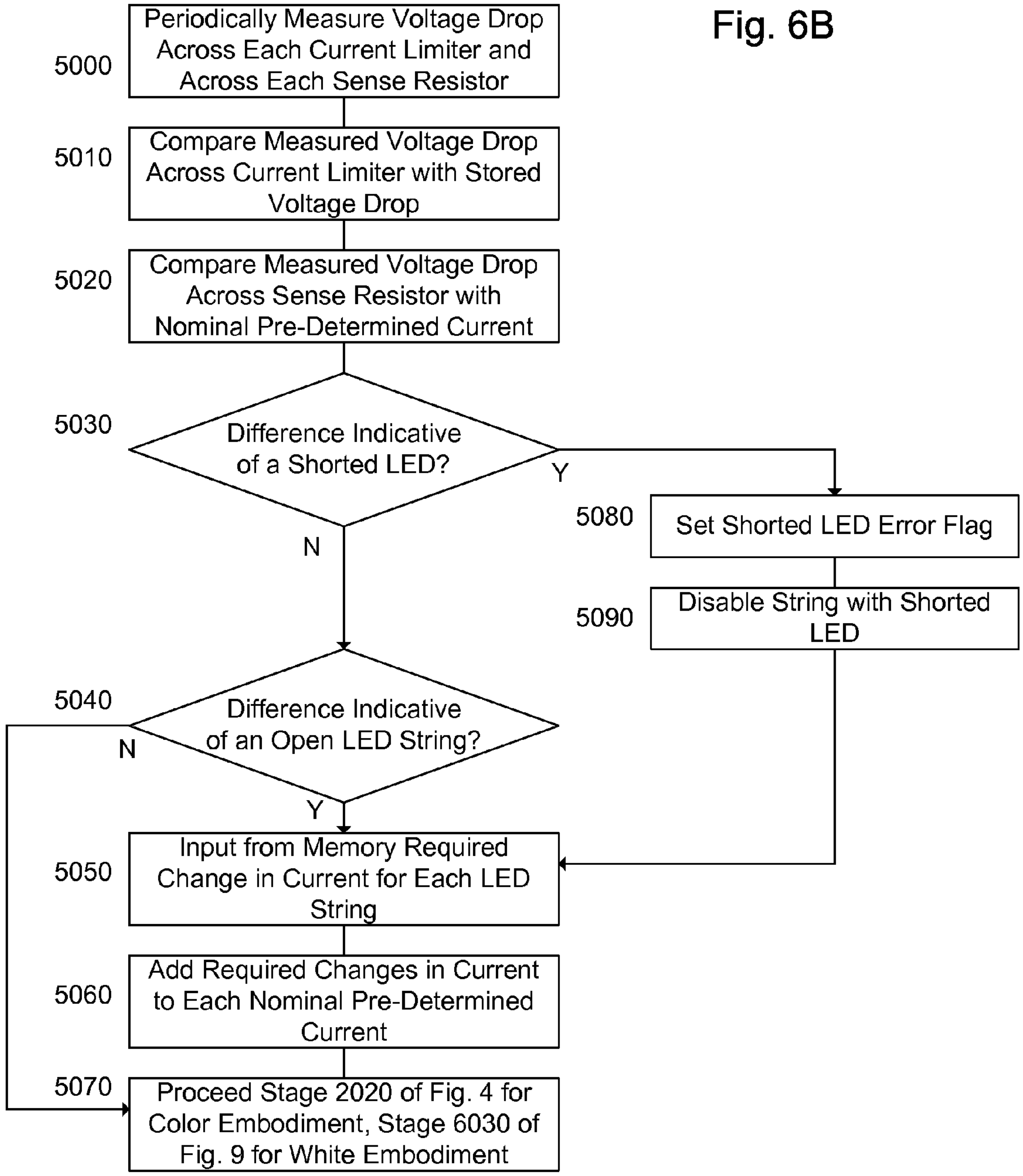
FIG. 6B illustrates a high level flow chart of the operation of the LED string controller of FIGS. 1, 2 and 8 to periodically check the voltage drop across each of the current limiters and the actual current flow through the LED strings so as to detect one of a short circuited LED and an open circuited LED string, disable the LED string associated with the detected short circuited LED, adjust the current of the remaining strings to compensate for the open or disabled LED string in accordance with the stored values of FIG. 5 and renter the high level flow chart of FIG. 4 so as to update the control of the controllable voltage source according to a principle of the invention.

FIG. 6B illustrates a high level flow chart of the operation of LED string controller 60 of FIGS. 1, 2 and 8 to periodically check the voltage drop across each of the current limiters 35 and the actual current flow through the LED strings 30, 210 so as to detect one of a short circuited LED and an open circuited LED string 30, 210, disable the LED string 30, 210 associated with the detected short circuited LED, adjust the current of the remaining strings to compensate for the open or disabled LED string 30, 210 in accordance with the stored values of FIG. 5 and renter the high level flow chart of FIG. 4, or FIG. 9, respectively, so as to update the control of the controllable voltage source according to a principle of the invention.

In stage 5000 the voltage drop across each of the current limiters 35 and the voltage drop across each of the sense resistors $R_{sense}$ are periodically measured and stored. The voltage drop across $R_{sense}$ is representative of the current flow through the associated LED string 30, 210 and the voltage drop across each current limiter 35, i.e. the voltage drop across FET 40, is indicative of the status of the current limiter 35, i.e. it is representative of the power dissipation across the current limiter 35. In stage 5010 the voltage drop across each current limiter 35 is compared with the voltage drop stored in memory 130 according to stage 2080 of FIG. 4, or stage 6080 of FIG. 9, respectively, and with the previous value stored by an earlier instance of stage 5000. In stage 5020 the voltage drop across each sense resistor $R_{sense}$ is compared with the expected voltage drop determined according to the nominal predetermined current and the known value of $R_{sense}$.

In stage 5030 the differences of stages 5010 and 5020 are analyzed to see if the difference is indicative of a shorted LED within a particular LED string 30, 210. For example, a short circuit of a single LED in an LED string 30, 210 will result in a sudden increase from a previous reading in the voltage drop across the particular current limiter 35 associated with the LED string 30, 210 exhibiting the short circuited LED. In the event that the difference in voltage drops of stages 5010 and 5020 are not indicative of short circuited LED in an LED string 30, 210 in stage 5040 the differences of stages 5010 and 5020 are analyzed to see if the difference is indicative of an open circuited LED within a particular LED string 30, 210. An open circuited LED within a particular LED string 30, 210 results in a disabled LED string 30, in which no current is sensed by sense resistor $R_{sense}$.

In the event that the difference in voltage drops of stages 5010 and 5020 are indicative of an open circuited LED in an LED string 30, in stage 5050 the required changes in current for each LED string other than the open circuited LED string 30, 210 previously stored in stage 3050 of FIG. 5, is input from memory 130. In stage 5060 the change in current of stage 5050 is added to the nominal predetermined current for each LED string 30, 210. Thus, the nominal predetermined current of each LED string 30, 210 is modified by the stored changes, or in an alternative embodiment are set to stored respective compensating values, and stage 2020 of FIG. 4 or stage 6030 of FIG. 9, respectively, is performed to adjust controllable voltage source 20 in accordance with the adjusted nominal predetermined current.

In the event that in stage 5040 the difference in voltage drops of stages 5010 and 5020 are not indicative of an open circuited LED in an LED string 30, 210 stage 2020 of FIG. 4 or stage 6030 of FIG. 9, respectively, is performed so as to again determine the lowest actual current string and close the feedback loop with controllable voltage source 20 accordingly.

In the event that in stage 5030 the difference in voltage drops of stages 5010 and 5020 are indicative of short circuited LED in an LED string 30, in stage 5080 an error flag indicative of a short circuited LED and indicating the particular LED string 30, 210 in which the short circuited LED has been detected is set. In stage 5090, the LED string 30, 210 in which the short circuited LED has been detected is disabled. In an exemplary embodiment the flag set in stage 5080 is operative to disable comparator 50 of the current limiter 35 associated with the LED string 30, 210 having the short circuited LED. Stage 5050 as described above is then performed to compensate for the disabled LED string 30, 210.

The above has been described in which both the voltage drop across $R_{sense}$ and the voltage drop across the current limiters 35 are both input and compared, however this is not meant to be limiting in any way. One of the voltage drop across $R_{sense}$ and the voltage drop across the current limiters 35 may be utilized, or a combination of the two may be utilized as a single function without exceeding the scope of the invention.

The methods of FIG. 5 and FIG. 6B may be implemented in an embodiment comprising white LEDs, in which compensation is calculated for each string so as to produce a uniform white backlight, or in an embodiment exhibiting a plurality of colors producing a combined white light without exceeding the scope of the invention.

Figure 7:
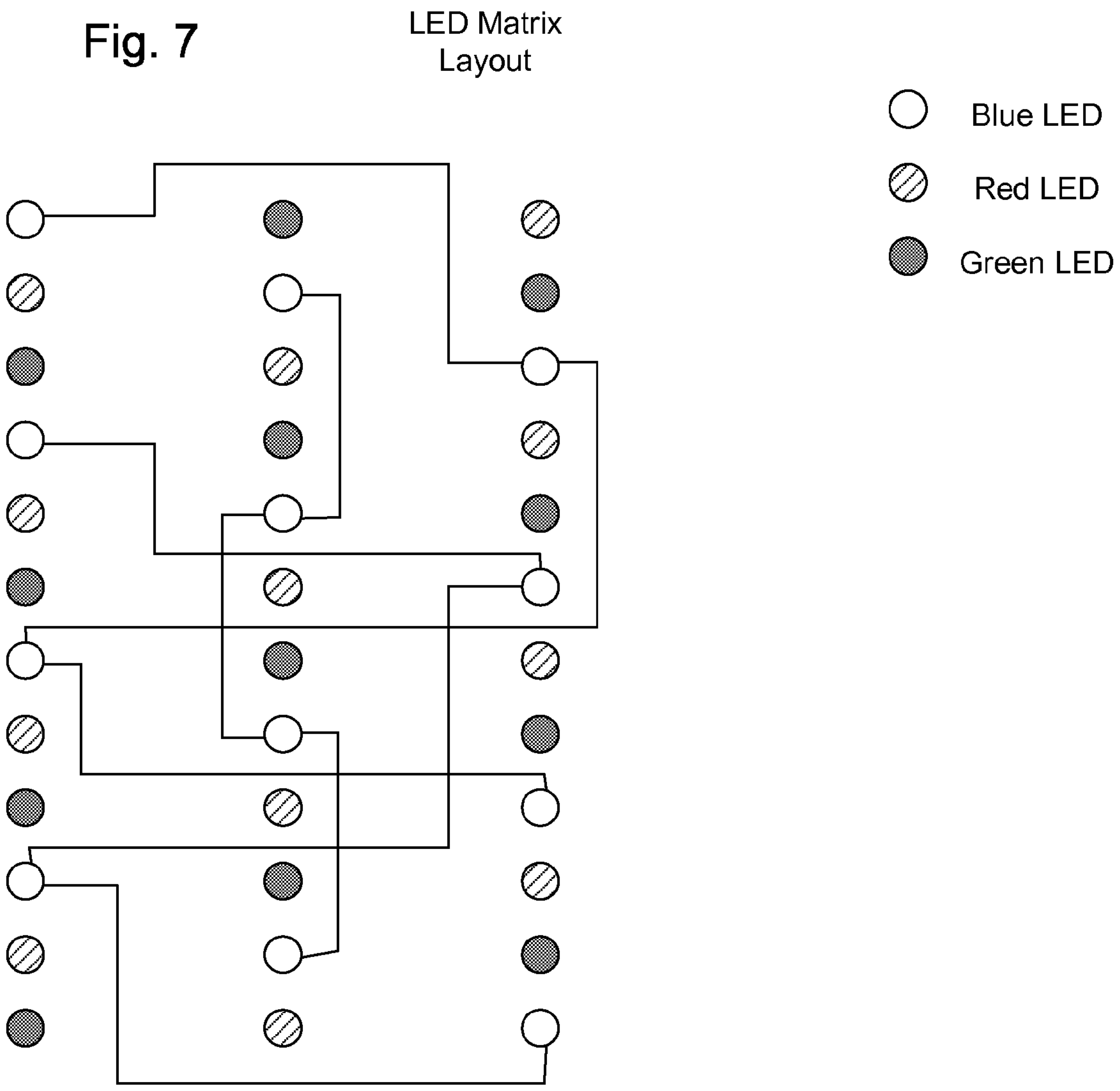
FIG. 7 illustrates an arrangement of LED strings in a matrix which allows for improved compensation of a failed LED string by other LED strings according to a principle of the invention.

FIG. 7 illustrates an arrangement of LED strings in a matrix which allows for improved compensation of a failed LED string 30 by other LED strings 30 according to a principle of the invention. FIG. 7 is illustrated as a frontal view of a direct backlight exhibiting three parallel rows of colored LED strings without the diffuser of LCD shown, however this is not meant to be limiting in any way and the principles of the invention are equally applicable to an indirect backlight, or a backlight set up in zones, or sub-panels, as described in U.S. Patent Application Publication S/N US 2006/0050529 A1 to Chou et al published Mar. 9, 2006 the entire contents of which is incorporated herein by reference. FIG. 7 is illustrated as having three blue LED strings, three red LED strings and 3 green LED strings, with the blue LEDs being illustrated by an open circle, the red LEDs being illustrated by a hashed circle and the green LEDs being illustrated by a shaded circle. The connection pattern for the green and red LED strings is not shown for simplicity and to clarify the unique connection matrix in accordance with a principle of the current invention.

The connection between each of the blue LEDs in each of the three LED strings are shown, and the connection is such that for each blue LED in a particular string of blue LEDs all the adjacent blue LEDs belong to a different string. Thus, in the event of a failure of one of the blue LED strings, an increased luminance from the remaining blue strings may be used to compensate for the failed blue LED string without exhibiting an unacceptable loss of white point or local discoloration. The above has been described as requiring an increase in current for the remaining blue LED strings, however this is not meant to be limiting in any way. Modification of the nominal predetermined current for the red and green LED strings may be additionally required without exceeding the scope of the invention.

Similarly, (not shown) the connection between each of the red LEDs in each of the three LED strings is such that for each red LED in a particular string of red LEDs all the adjacent red LEDs belong to a different string. Thus, in the event of a failure of one of the red LED strings, an increased luminance from the remaining red strings may be used to compensate for the failed red LED string without exhibiting an unacceptable loss of white point or local discoloration. The above has been described as requiring an increase in current for the remaining red LED strings, however this is not meant to be limiting in any way. Modification of the nominal predetermined current for the blue and green LED strings may be additionally required without exceeding the scope of the invention.

Similarly, (not shown) the connection between each of the green LEDs in each of the three LED strings is such that for each green LED in a particular string of green LEDs all the adjacent green LEDs belong to a different string. Thus, in the event of a failure of one of the green LED strings, an increased luminance from the remaining green strings may be used to compensate for the failed green LED string without exhibiting an unacceptable loss of white point or local discoloration. The above has been described as requiring an increase in current for the remaining green LED strings, however this is not meant to be limiting in any way. Modification of the nominal predetermined current for the blue and red LED strings may be additionally required without exceeding the scope of the invention.

The above has been described as utilizing a plurality of controllable voltage sources, and controlling the respective voltages so as to minimize power dissipation, however this is not meant to be limiting in any way. In an alternative embodiment a controllable current source exhibiting a sufficient voltage is supplied in place of the controllable voltage sources without exceeding the scope of the invention.

Figure 10:
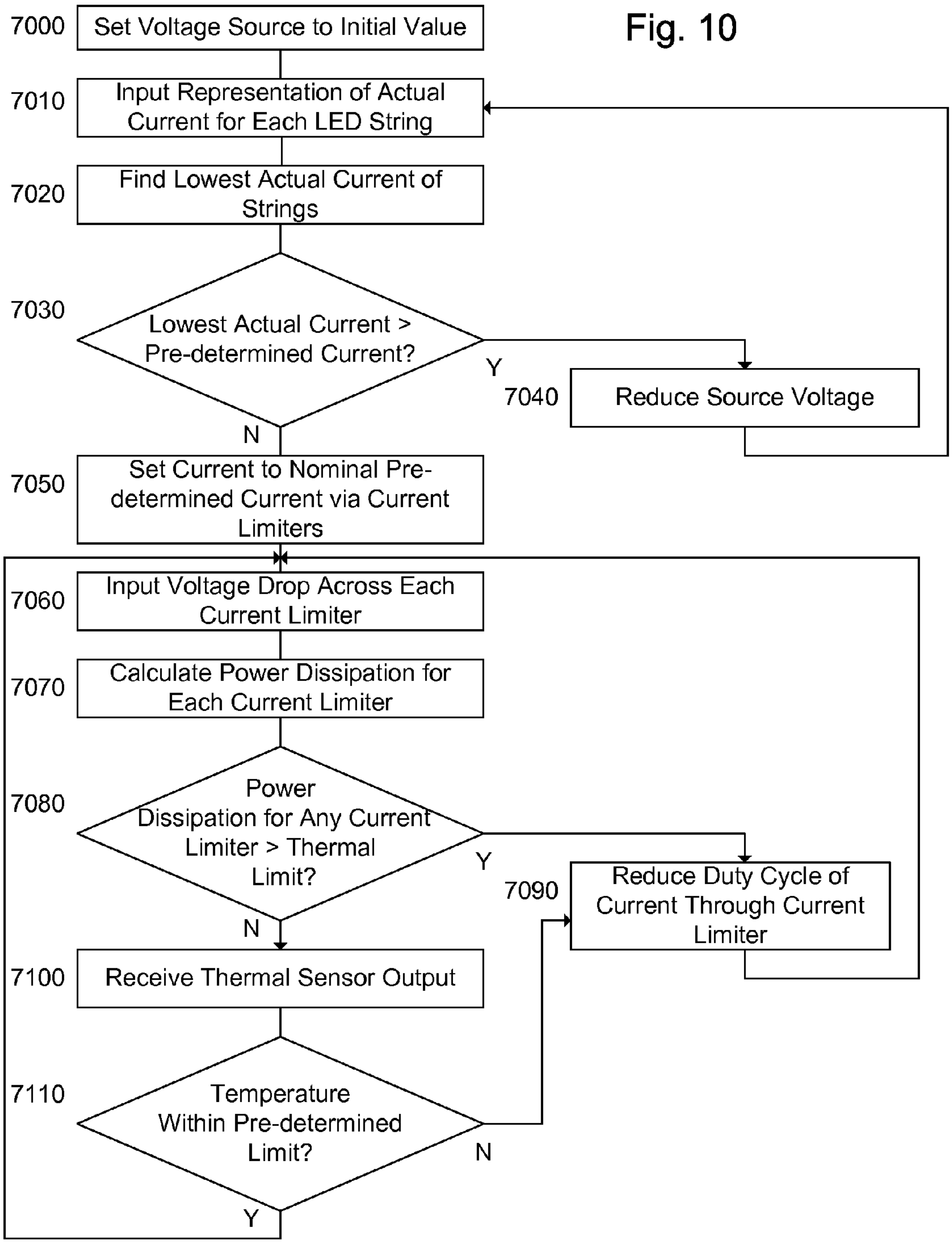
FIG. 10 illustrates a high level flow chart of the operation of the LED string controller of FIG. 2 comprising internal current limiters in accordance with the principle of the current invention to prevent thermal overload resulting from power dissipation of the internal current limiters.

FIG. 10 illustrates a high level flow chart of the operation of the LED string controller of FIGS. 2, 8 comprising internal current limiters 35 in accordance with the principle of the current invention to prevent thermal overload resulting from power dissipation of the internal current limiters. In stage 7000, the voltage source is set to an initial value. Preferably the initial value is the highest value of the nominal range. In stage 7010 a representation of the actual current flow through each LED string 30, 210 is input. In stage 7020, the lowest actual current from among the LED strings 30, 210 is found. It is to be understood that the lowest actual current is found from among the LED strings 30, 210 sharing a common voltage source.

In stage 7030, the lowest actual current of stage 2020 is compared to a pre-determined nominal current. In the event that the lowest actual current is greater than the pre-determined nominal current, in stage 7040 the output of controllable voltage source 20 is reduced and stage 7010 as described above is again performed. In one embodiment the voltage is reduced in stage 7040 by a pre-determined step, and in another embodiment a feedback of the voltage representation of the lowest current found in stage 7030 is fed back.

In the event that in stage 7030 the lowest actual current is not greater than the pre-determined nominal current, in stage 7050 the current for all LED strings is set to a pre-determined nominal value as described in relation to stage 7030 via the operation of the internal current limiters 35. In stage 7060 the voltage drop across each of the internal current limiters 35 are input and in stage 7070 the power dissipation across each of the internal current limiters 35 is calculated using the value input in stage 7060. In one embodiment the current flow through the internal current limiters 35 are again input as described above in relation to stage 7010 for use in the calculation, and in another embodiment the value set in stage 7050 is used in the calculation.

In stage 7080 the power dissipation calculated in stage 7070 for each internal current limiter 35 is compared with a pre-determined thermal limit. In the event that the power dissipation for any of the internal current limiters 35 exceeds the pre-determined limit, in stage 7090 the duty cycle of the internal current limiter 35 is reduced. In one embodiment the duty cycle to be used is directly calculated to reduce the power consumption to be less than the predetermined limit, and in another embodiment the duty cycle is reduced by a predetermined step. Optionally, a current limit value of the internal current limiter 35 receiving the reduced duty cycle is increased to thereby at least partially compensate for said reduced duty cycle. Stage 7060 is then performed as described above.

In the event that in stage 7080 the power dissipation for any of the internal current limiters 35 does not exceed the predetermined limit, in stage 7100 input from thermal sensor 180 is received. In stage 7110 the input received in stage 7100 is compared with a predetermined temperature maximum. In the event the temperature input from thermal sensor 180 is within the predetermined limit, stage 7060 is again performed. In the event the temperature input from the thermal sensors is not within the predetermined limit, stage 7090 as described above is performed.

Thus the present embodiments enable a backlighting system exhibiting a plurality of LED strings, a plurality of current limiters each in series with a particular one of the plurality of LED strings, and a pulse width modulation functionality. The control circuitry is operative to monitor at least one thermal condition responsive to the plurality of current limiters, and in the event of a predetermined thermal condition, reduce the thermal stress by reducing the duty cycle of at least one of the plurality of LED strings.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

We claim:

1. A system for powering and controlling an LED backlight, the system comprising:

a control circuitry;

a plurality of LED strings;

a pulse width modulation functionality associated with said control circuitry and arranged to pulse width modulate a current flow through each of said plurality of LED strings;

a plurality of current limiters responsive to said control circuitry, each of said plurality of current limiters associated with a particular one of said plurality of LED strings and arranged to limit current flow of said pulse width modulated current there-through to a value settable responsive to an output of said control circuitry; and a current sensor in communication with said control circuitry and arranged to output an indication of the current flow through each of said plurality of current limiters, said control circuitry arranged to:

determine a thermal condition of at least one of said plurality of current limiters;

reduce, in the event that the determined thermal condition of said at least one of said plurality of current limiters exceeds a predetermined limit, a duty cycle of said pulse width modulation functionality of said current flow through said at least one of said plurality of current limiters exhibiting said exceeded thermal condition; and compensate, responsive to said indication of current flow, for any inaccuracy in the amount of current flow through any of said plurality of LED strings by adjusting the appropriate PWM duty cycle.

2. A system according to claim 1, wherein said control circuitry is further arranged in the event of said thermal condition to reduce the duty cycle of said pulse width modulation functionality of said current flow through all of said plurality of current limiters.

3. A system according to claim 1, wherein said control circuitry is further arranged to increase a current limit value of said one of said plurality of current limiters exhibiting said exceeded thermal condition to thereby at least partially compensate for said reduced duty cycle.

4. A system according to claim 1, further comprising a thermal sensor responsive to at least one of said plurality of current limiters, and wherein said control circuitry is operative responsive to said thermal sensor to detect said thermal condition.

5. A system according to claim 1, further comprising a voltage sensor arranged to output an indication of the voltage drop across each of said plurality of current limiters, said voltage sensor being in communication with said control circuitry, and wherein said control circuitry is operative responsive to said voltage sensor to detect said thermal condition.

6. A system according to claim 1, further comprising a voltage sensor arranged to output an indication of the voltage drop across each of said current limiters, said voltage sensor and said current sensor being in communication with said control circuitry, and wherein said control circuitry is arranged to detect said thermal condition responsive to said voltage sensor and said current sensor.

7. A system according to claim 1, wherein said control circuitry is further operative to:

monitor said pulse width modulation functionality, and in the event the duty cycle of said pulse width modulation functionality exceeds a maximum, to adjust the current limit of at least one of said current limiters and reduce the duty cycle of said pulse width modulation functionality thereby maintaining a predetermined luminance.

8. A system according to claim 7, wherein the adjustment of the current limit of said at least one of said current limiters is by a predetermined amount.

9. A system according to claim 7, wherein said current is adjusted and said pulse width modulation duty cycle is reduced so as to maintain said predetermined luminance while reducing the maximum duty cycle to a predetermined amount.

10. A system according to claim 7, wherein said current is adjusted and said pulse width modulation duty cycle is reduced so as to maintain said predetermined luminance while reducing the maximum duty cycle by a predetermined amount.

11. A system according to claim 1, wherein said control circuitry is further operative to monitor an electrical characteristic of each of said plurality of LED strings and determine, responsive to said monitored electrical characteristic, if any of said plurality of LED strings exhibits and open circuit condition.

12. A system according to claim 11, wherein responsive to said determined open circuit condition, said control circuitry is further operative to adjust the current of at least one of the remaining LED strings by a predetermined amount to at least partially compensate for said determined open circuit condition.

13. A system according to claim 12, wherein said plurality of LED strings are arranged in a matrix such that said at least partial compensation maintains a substantial uniform color.

14. A method for powering and controlling an LED backlight comprising:

providing a plurality of LED strings;

providing a plurality of current limiters, each of said provided plurality of current limiters limiting a current flow through a particular one of said provided plurality of LED strings to a settable value;

pulse width modulating said current flow through each of said provided plurality of LED strings;

obtaining an indication of the actual amount of current flow through each of said provided plurality LED string;

monitoring a thermal condition associated with at least one of said provided plurality of current limiters;

reducing, in the event that the monitored thermal condition exceeds a predetermined limit, a duty cycle of said pulse width modulating of said current flow through said at least one of said provided plurality of current limiters exhibiting said exceeding thermal condition; and compensating, responsive to said obtained indication of current flow, for any inaccuracy in the amount of current flow through any of said plurality of LED strings by adjusting the appropriate PWM duty cycle.

15. A method according to claim 14, further comprising in the event of said predetermined thermal condition, reducing a duty cycle of said pulse width modulating of said current flow through all of said provided plurality of current limiters.

16. A method according to claim 14, further comprising:

increasing said settable value of said one of said plurality of current limiters exhibiting said exceeding thermal condition to thereby at least partially compensate for said reduced duty cycle.

17. A method according to claim 14, further comprising:

providing a thermal sensor responsive to at least one of said provided plurality of current limiters, wherein said monitoring is responsive to said provided thermal sensor.

18. A method according to claim 14, further comprising:

providing a voltage sensor arranged to output an indication of the voltage drop across each of said provided plurality of current limiters, wherein said monitoring is responsive to said output of said provided voltage sensor.

19. A method according to claim 14, further comprising:

providing a voltage sensor arranged to output an indication of the voltage drop across each of said provided plurality of current limiters; and providing a current sensor arranged to provide said indication of the current flow through each of said provided plurality of current limiters, wherein said monitoring is responsive to said output of said provided voltage sensor and said provided current sensor.

20. A method according to claim 14, further comprising:

monitoring said pulse width modulating, and in the event the duty cycle of said pulse width modulation functionality exceeds a predetermined maximum, adjusting said settable value of least one of said provided current limiters and reducing the duty cycle of said pulse width modulating thereby maintaining a predetermined luminance.

21. A method according to claim 20, wherein said adjustment of said settable value of said at least one of said provided current limiters is by a predetermined amount.

22. A method according to claim 20, wherein said adjustment of said settable value of said at least one of said provided current limiters and said reducing the duty cycle of said pulse width modulating maintains said predetermined luminance while reducing the maximum duty cycle to a predetermined amount.

23. A method according to claim 20, wherein said adjustment of said settable value of said at least one of said provided current limiters and said reducing the duty cycle of said pulse width modulating maintains said predetermined luminance while reducing the maximum duty cycle by a predetermined amount.

24. A method according to claim 14, further comprising:

monitoring an electrical characteristic of each of said provided plurality of LED strings; and determining, responsive to said monitoring, if any of said provided plurality of LED strings exhibits and open circuit condition.

25. A method according to claim 24, further comprising responsive to said determined open circuit condition:

adjusting one of said settable value and the duty cycle of said pulse width modulating of at least one of the remaining provided LED strings by a predetermined amount to at least partially compensate for said determined open circuit condition.

26. A method according to claim 24, further comprising:

arranging said provided plurality of LED strings in a matrix such that said at least partial compensation maintains a substantial uniform color.

* * * * *